United States Patent
Namerikawa et al.

(10) Patent No.: US 8,409,484 B2
(45) Date of Patent: Apr. 2, 2013

(54) METHOD FOR PRODUCING A CERAMIC COMPACT

(75) Inventors: Masahiko Namerikawa, Seto (JP); Yukihisa Takeuchi, Nagoya (JP); Shinsuke Yano, Nagoya (JP); Kazuyoshi Shibata, Mizunami (JP); Koji Ikeda, Tsu (JP); Masahiro Abe, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 354 days.

(21) Appl. No.: 12/637,008

(22) Filed: Dec. 14, 2009

(65) Prior Publication Data
US 2010/0092657 A1   Apr. 15, 2010

Related U.S. Application Data

(62) Division of application No. 12/628,432, filed on Dec. 1, 2009, now Pat. No. 7,973,238, which is a division of application No. 12/179,981, filed on Jul. 25, 2008, now Pat. No. 8,034,402.

(60) Provisional application No. 60/982,493, filed on Oct. 25, 2007.

(30) Foreign Application Priority Data

| Jul. 27, 2007 | (WO) | PCT/JP2007/064781 |
| Feb. 8, 2008 | (JP) | 2008-029545 |
| Jul. 11, 2008 | (JP) | 2008-181565 |

(51) Int. Cl.
 *B29C 39/10* (2006.01)
(52) U.S. Cl. ........ 264/132; 264/135; 264/261; 264/275; 264/263; 264/272.17
(58) Field of Classification Search .......... None
See application file for complete search history.

(56) References Cited

U.S. PATENT DOCUMENTS

| 2,966,704 | A | * | 1/1961 | O'Brian et al. | 264/611 |
| 3,074,143 | A | * | 1/1963 | Smith | 427/191 |
| 3,085,295 | A | * | 4/1963 | Pizzino et al. | 264/255 |
| 3,324,014 | A | * | 6/1967 | Modjeska | 205/122 |
| 3,870,776 | A | * | 3/1975 | McMahon | 419/19 |
| 3,991,029 | A | | 11/1976 | Adelman | |
| 5,035,275 | A | | 7/1991 | Yamaguchi | |
| 5,240,671 | A | | 8/1993 | Carey | |
| 5,359,311 | A | * | 10/1994 | Kawabata et al. | 336/83 |
| 6,104,272 | A | * | 8/2000 | Yamamoto et al. | 336/83 |
| 6,143,116 | A | | 11/2000 | Hayashi et al. | |
| 6,560,851 | B1 | * | 5/2003 | Yamamoto et al. | 29/602.1 |

(Continued)

FOREIGN PATENT DOCUMENTS

| JP | 40-19975 | 9/1965 |
| JP | 56-70620 | 6/1981 |

(Continued)

OTHER PUBLICATIONS

Japanese Office Action, Japanese Application No. 2008-099688, dated May 22, 2012 (6 pages).

(Continued)

*Primary Examiner* — Edmund H. Lee
(74) *Attorney, Agent, or Firm* — Burr & Brown

(57) ABSTRACT

A ceramic compact having a patterned conductor is obtained by coating the patterned conductor with a slurry and then by hardening the slurry. The slurry is prepared by mixing a thermosetting resin precursor, a ceramic powder, and a medium. In the ceramic compact, an isocyanate- or isothiocyanate-containing gelling agent and a hydroxyl-containing polymer are reacted and hardened to produce a thermosetting resin. The hydroxyl-containing polymer is preferably a butyral resin, an ethylcellulose-based resin, a polyethyleneglycol-based resin, or a polyether-based resin.

2 Claims, 15 Drawing Sheets

U.S. PATENT DOCUMENTS

| | | |
|---|---|---|
| 6,700,192 B2 * | 3/2004 | Matsuzawa et al. ............ 257/692 |
| 7,189,599 B2 * | 3/2007 | Tanaka ........................... 438/123 |
| 7,241,414 B2 * | 7/2007 | Ho et al. ..................... 264/272.17 |
| 2002/0055571 A1 | 5/2002 | Hirano et al. |
| 2005/0212185 A1 | 9/2005 | Miyazawa |
| 2005/0214517 A1 | 9/2005 | Sugimoto et al. |
| 2006/0021691 A1 | 2/2006 | Sakurai et al. |
| 2006/0049131 A1 | 3/2006 | Satou |
| 2007/0034841 A1 | 2/2007 | Satou et al. |
| 2010/0127423 A1 * | 5/2010 | Kobayashi et al. ...... 264/272.19 |

FOREIGN PATENT DOCUMENTS

| | | | |
|---|---|---|---|
| JP | 63030202 | * | 2/1988 |
| JP | 02-058816 | | 2/1990 |
| JP | 06-191925 | | 7/1994 |
| JP | 06191925 | * | 7/1994 |
| JP | 08-167537 | | 6/1996 |
| JP | 10-107445 A1 | | 4/1998 |
| JP | 11012043 | * | 1/1999 |
| JP | 11012044 | * | 1/1999 |
| JP | 11-126724 | | 5/1999 |
| JP | 11-268961 | | 10/1999 |
| JP | 11-300727 | | 11/1999 |
| JP | 2000-138129 | | 5/2000 |
| JP | 2001-176751 | | 6/2001 |
| JP | 2002-329419 | | 1/2002 |
| JP | 2002-361617 | | 12/2002 |
| JP | 2005-001279 | | 1/2005 |
| JP | 2006-203157 | | 8/2006 |

OTHER PUBLICATIONS

Japanese Office Action, Japanese Patent Application No. 2008-181565 (with English Translation), dated Sep. 4, 2012 (5 pages).

* cited by examiner

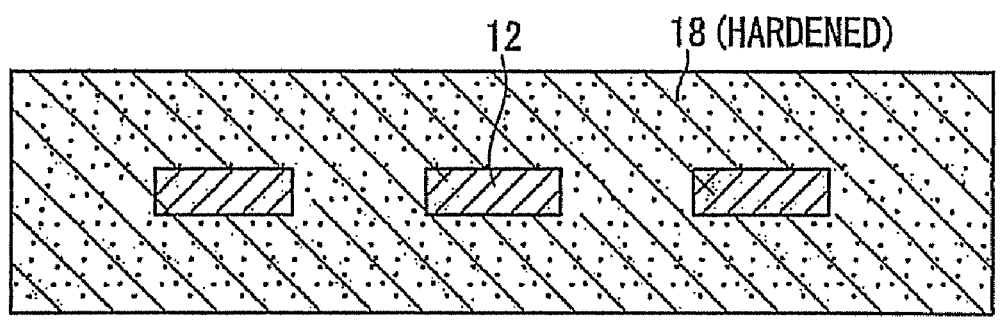

METHOD FOR PRODUCING A CERAMIC COMPACT

CROSS-REFERENCE TO RELATED APPLICATIONS

This application is a divisional of U.S. application Ser. No. 12/628,432, filed Dec. 1, 2009, now U.S. Pat. No. 7,973,238, which is a divisional of U.S. application Ser. No. 12/179,981, filed Jul. 25, 2008, now U.S. Pat. No. 8,034,402, and is based upon and claims the benefit of priority from PCT International Application No. PCT/JP2007/064781 filed on Jul. 27, 2007, U.S. Provisional Application No. 60/982,493 filed on Oct. 25, 2007, now abandoned Japanese Patent Application No. 2008-029545 filed on Feb. 8, 2008 and Japanese Patent Application No. 2008-181565 filed on Jul. 11, 2008, the contents of which are incorporated herein by reference.

BACKGROUND OF THE INVENTION

1. Field of the Invention

The present invention relates to a ceramic compact having a buried conductor, a ceramic part, a method for producing a ceramic compact, and a method for producing a ceramic part. For example, the ceramic compact and the ceramic part can be used for forming a passive component part excellent in radio-frequency properties.

2. Description of the Related Art

A passive component part using a dielectric substrate can be produced such that a conductor pattern is printed on a green sheet containing a ceramic powder and a resin, and a plurality of such green sheets are stacked, integrated, shaped, and burned (see, for example, Japanese Patent Publication No. 40-019975 and Japanese Laid-Open Patent Publication No. 02-058816).

In this case, the conductor pattern formed on the green sheet has a convex shape, so that the portions surrounding the conductor pattern are not pressed in the process of stacking the green sheets. As a result, the green sheet may be peeled off, and an edge of the conductor pattern may be crushed, resulting in deterioration in the electrical properties of the conductor. Further, the thickness of the conductor pattern cannot be increased because of these problems, whereby the resistance value can be reduced and the radio-frequency properties can be improved only to a limited extent.

To solve the above problems, in a conventional method, a conductor paste is printed on a base or a green sheet such as a resin film, a slurry of a ceramic powder and a resin is applied thereto, and the resultant is immersed in a cationic coagulation bath to convert the slurry to a gel, whereby a conductor pattern is buried in the green sheet (see, for example, Japanese Patent Publication No. 40-019975, and Japanese Laid-Open Patent Publication Nos. 02-058816 and 2005-001279).

In another conventional method, a thermoplastic resin, a thermosetting resin, or an ultraviolet curing resin is added to a conductor paste, whereby deformation of a conductor pattern is prevented (see, for example, Japanese Laid-Open Patent Publication No. 08-167537).

In a further conventional method, a metal wire coil is placed in a casting mold, the casting mold is filled with a ceramic slurry such that the metal wire is enclosed by the ceramic slurry, and the resultant is dried to produce an electronic part having the metal wire coil enclosed in a ceramic compact (see, for example, Japanese Laid-Open Patent Publication No. 11-126724).

In the method proposed in Japanese Patent Publication No. 40-019975 and Japanese Laid-Open Patent Publication Nos. 02-058816 and 2005-001279, when the slurry contains the ceramic powder and a thermoplastic resin, and the conductor paste contains a thermoplastic resin, the slurry is greatly shrunk in the drying process. As a result, since the portions in the vicinity of the conductor may be cracked, the integration of the ceramic compact and the conductor is deteriorated, and the green sheet becomes uneven due to the convex shape of the conductor. Further, because the thermoplastic resin in the conductor paste is easily dissolved in a solvent, the conductor may be disadvantageously dissolved in the ceramic, and the patterned shape of the conductor may be deformed, when the ceramic compact is formed.

Furthermore, in the method of Japanese Laid-Open Patent Publication No. 2005-001279, a large number of processes are required to produce a multilayered conductor pattern stack because the layers have to be separately subjected to the processes of the formation of the conductor pattern on the green sheet, the application of the slurry, the immersion in the cationic coagulation bath, and the drying.

In the method of Japanese Laid-Open Patent Publication No. 08-167537, the conductor pattern is printed on the green sheet, and a plurality of such green sheets are stacked, integrated, and pressed. Therefore, the portions in the vicinity of the conductor pattern are not pressed, and the green sheet may be peeled from the stack, like the method of Japanese Patent Publication No. 40-019975 and Japanese Laid-Open Patent Publication No. 02-058816.

The method of Japanese Laid-Open Patent Publication No. 11-126724 is suitable for burying an element such as a resistor or a coil in the ceramic compact. However, the method cannot be used for forming a multilayer conductor pattern stack.

SUMMARY OF THE INVENTION

In view of the above problem, an object of the present invention is to provide a ceramic compact that can be produced without peeling or deformation of a conductor pattern and can have an increased conductor pattern thickness, a lowered resistance, and improved radio-frequency properties, a ceramic part produced from the ceramic compact, a method for producing the ceramic compact, and a method for producing the ceramic part.

According to a first aspect of the present invention, there is provided a ceramic compact having a patterned conductor, which is obtained by coating the patterned conductor with a slurry and by hardening the slurry. The slurry is prepared by mixing a thermosetting resin precursor, a ceramic powder, and a medium.

In the first aspect, the patterned conductor may be formed on a base, and the slurry may be applied to the base such that the patterned conductor is coated with the slurry, and then hardened to obtain the ceramic compact.

In the first aspect, the thermosetting resin precursor may comprise an isocyanate- or isothiocyanate-containing gelling agent and a hydroxyl-containing polymer.

In this case, the hydroxyl-containing polymer is preferably a butyral resin, an ethylcellulose-based polymer, a polyethyleneglycol-based polymer, or a polyether-based polymer.

In the first aspect, the patterned conductor may be prepared by forming a conductor paste into a pattern and by hardening the conductor paste. The conductor paste contains a thermosetting resin precursor and a powder of at least one metal selected from silver (Ag), gold (Au), and copper (Cu) series metals.

According to a second aspect of the present invention, there is provided a ceramic part obtained by burning the ceramic compact of the first aspect.

According to a third aspect of the present invention, there is provided a method for producing a ceramic compact, comprising: a conductor forming step of forming a patterned conductor; a slurry supplying step of coating the patterned conductor with a slurry prepared by mixing a thermosetting resin precursor, a ceramic powder, and a medium; and a slurry hardening step of hardening the slurry.

In the third aspect, the patterned conductor may be formed on a base in the conductor forming step, and the slurry may be applied to the base such that the patterned conductor is coated with the slurry in the slurry supplying step.

In the third aspect, the thermosetting resin precursor may comprise an isocyanate- or isothiocyanate-containing gelling agent and a hydroxyl-containing polymer.

In this case, the hydroxyl-containing polymer is preferably a butyral resin, an ethylcellulose-based polymer, a polyethyleneglycol-based polymer, or a polyether-based polymer.

The amount of the hydroxyl-containing polymer may be larger than the stoichiometric amount required for a reaction with the gelling agent.

In the third aspect, the patterned conductor may be formed on a film in the conductor forming step, and the film having the patterned conductor may be placed in a casting mold and the slurry may be cast into the casting mold in the slurry supplying step.

In this case, in the slurry supplying step, the film and another film may be stacked with a spacer interposed therebetween in the casting mold such that the patterned conductor faces the other film, and the slurry may be cast into a space formed by the spacer.

A release agent applied to the film may be different in peel force from a release agent applied to the other film.

In the third aspect, the patterned conductor may be prepared by forming a conductor paste into a pattern and by hardening the conductor paste in the conductor forming step. The conductor paste contains a thermosetting resin precursor and a powder of at least one metal selected from silver (Ag), gold (Au), and copper (Cu) series metals.

In this case, the thermosetting resin precursor contained in the conductor paste preferably comprises a phenol resin or a self-reactive resol resin.

In the third aspect, the thermosetting resin precursor used in the slurry is preferably a polyurethane resin precursor.

According to a fourth aspect of the present invention, there is provided a method for producing a ceramic part, comprising preparing a ceramic compact and burning the ceramic compact. The ceramic compact is prepared by a process comprising: a conductor forming step of forming a patterned conductor; a slurry supplying step of coating the patterned conductor with a slurry prepared by mixing a thermosetting resin precursor, a ceramic powder, and a medium; and a slurry hardening step of hardening the slurry.

As described above, by using the ceramic compact, the ceramic part, the ceramic compact producing method, and the ceramic part producing method of the present invention, the peeling and deformation of the conductor pattern can be prevented, the thickness of the conductor pattern can be increased, the resistance can be lowered, and the radio-frequency properties can be improved easily.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 1 is a cross-sectional view showing a first ceramic compact;

DETAILED DESCRIPTION OF THE INVENTION

A plurality of illustrative embodiments of the ceramic compact, the ceramic part, the ceramic compact producing method, and the ceramic part producing method of the present invention will be described below with reference to FIGS. 1 to 15.

First Embodiment

As shown in FIG. 1, a ceramic compact according to a first embodiment (hereinafter referred to as a first ceramic compact 10A) has a buried, patterned conductor 12.

Figure 2A:
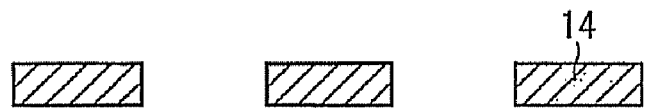
FIG. 2A is a cross-sectional view showing a pattern of a conductor paste.
Figure 2B:
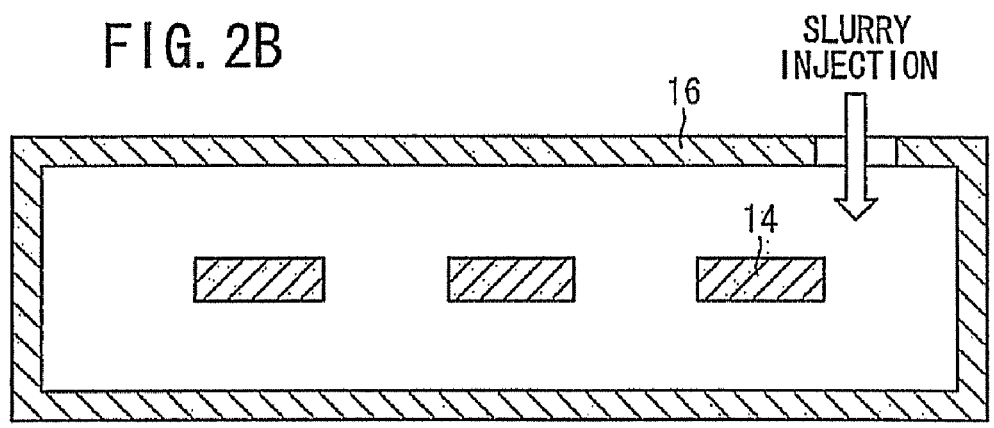
FIG. 2B is a cross-sectional view showing the pattern placed in a casting mold.
Figure 2C:
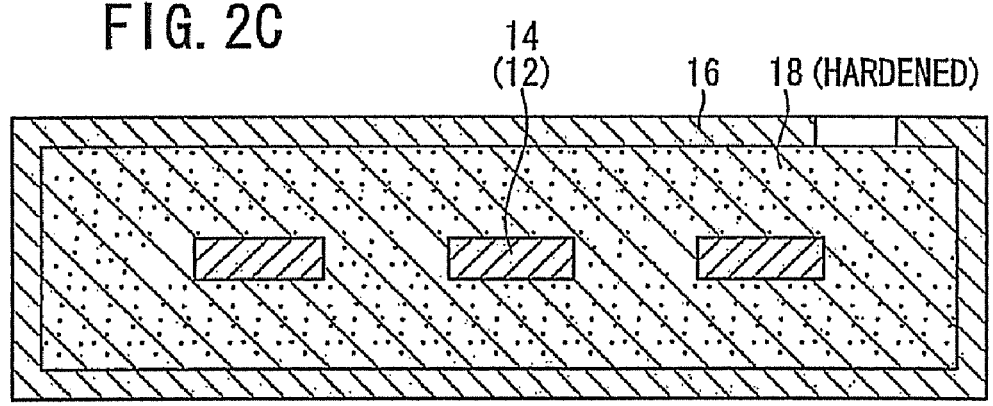
FIG. 2C is a cross-sectional view showing a slurry hardened in the casting mold.

The first ceramic compact 10A can be produced such that a conductor paste 14 containing a resin and a powder of at least one metal selected from silver (Ag), gold (Au), and copper (Cu) series metals is formed and hardened into a predetermined shape as shown in FIG. 2A, the conductor paste 14 is placed in a casting mold 16 and a gel casting slurry containing a thermosetting resin precursor, a ceramic powder, and a medium (hereinafter referred to as a slurry 18) is cast into the casting mold 16 as shown in FIG. 2B, and the slurry 18 is hardened as shown in FIG. 2C. The casting mold 16 shown in the cross-sectional view may be partly opened as long as the slurry 18 does not leak therefrom.

The resin used in the conductor paste 14 is preferably a thermosetting resin precursor. In this case, the thermosetting resin precursor is preferably a self-reactive, resol-type phenolic resin.

The thermosetting resin precursor used in the slurry 18 is preferably a polyurethane resin precursor.

The patterned conductor 12 may be prepared by printing the conductor paste 14 into a pattern and then by hardening the conductor paste 14.

Figure 3A:
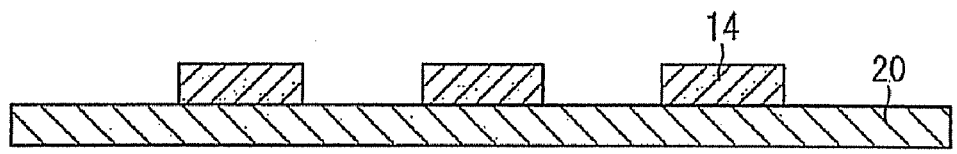
FIG. 3A is a cross-sectional view showing a pattern of a conductor paste formed on a film.
Figure 3B:
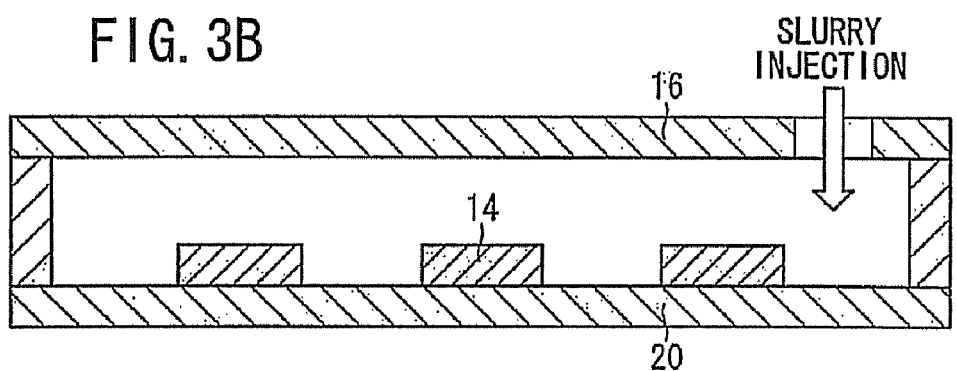
FIG. 3B is a cross-sectional view showing the film placed in a casting mold.
Figure 3C:
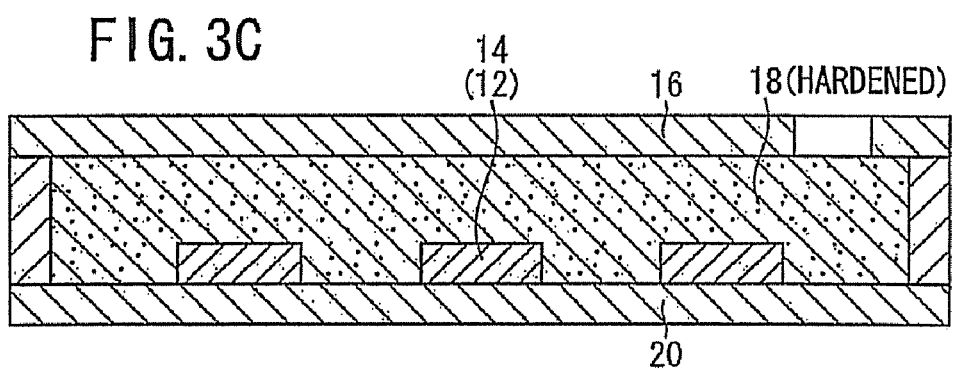
FIG. 3C is a cross-sectional view showing a slurry hardened in the casting mold.
Figure 4A:
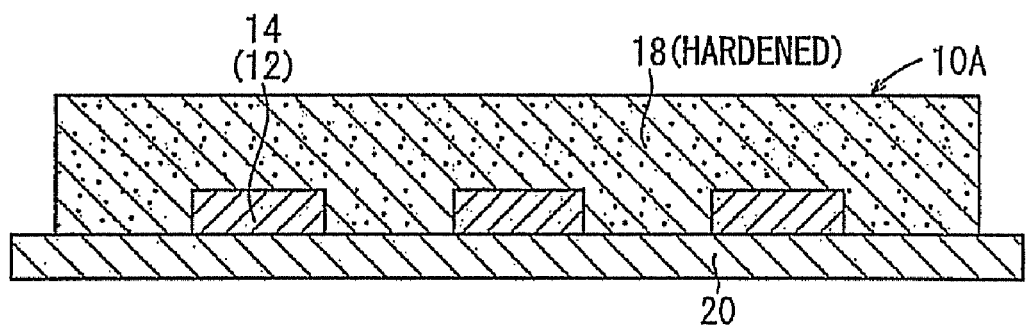
FIG. 4A is a cross-sectional view showing the film having a first ceramic compact separated from the casting mold.
Figure 4B:
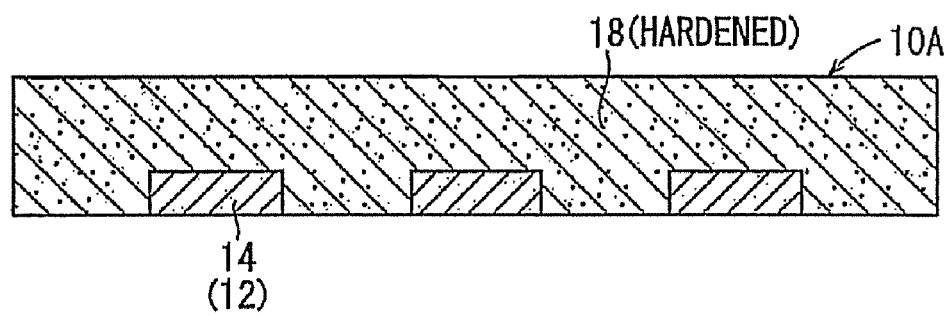
FIG. 4B is a cross-sectional view showing the first ceramic compact separated from the film.

For example, the first ceramic compact 10A may be produced such that the conductor paste 14 is printed on a film 20 into a pattern and then is hardened to form the patterned conductor 12 as shown in FIG. 3A, the film 20 is placed in the casting mold 16 and the slurry 18 is cast into the casting mold 16 as shown in FIG. 3B, and the slurry 18 is hardened as shown in FIG. 3C. In this case, the first ceramic compact 10A having the buried, patterned conductor 12 is disposed on the film 20 as shown in FIG. 4A. Thus, the first ceramic compact 10A having the buried, patterned conductor 12 can be obtained by removing the film 20 as shown in FIG. 4B.

Figure 5:
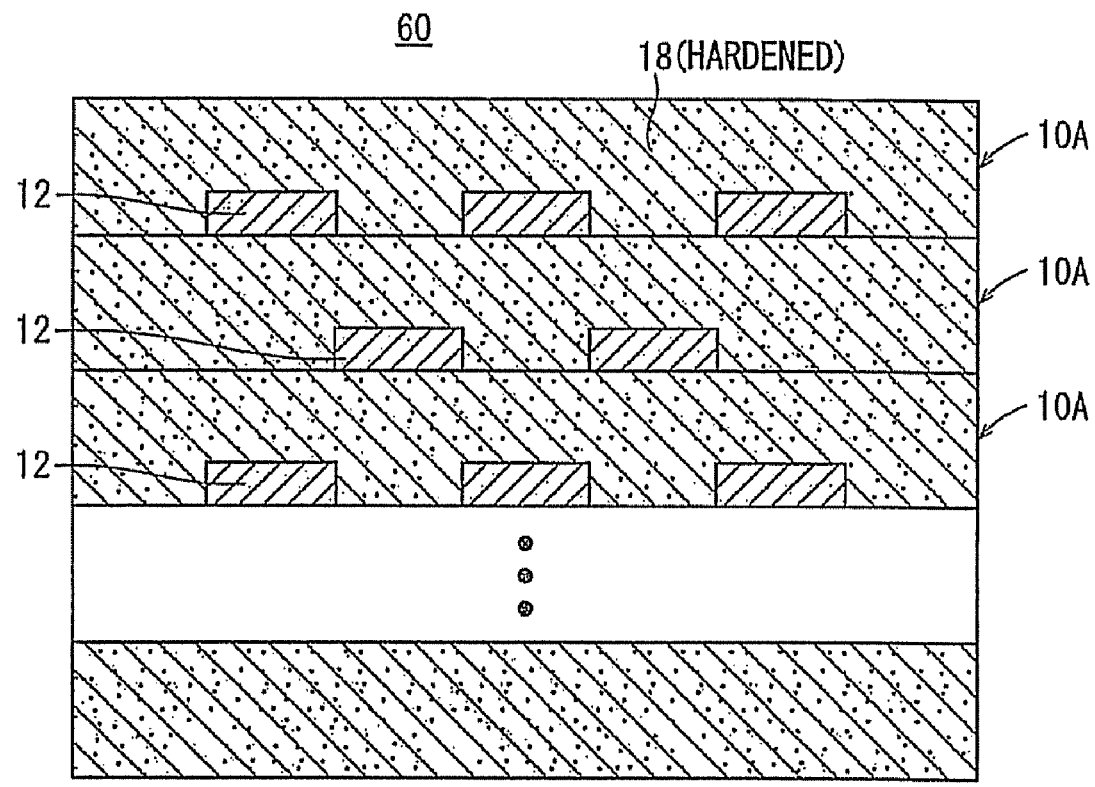
FIG. 5 is a cross-sectional view showing a first stack produced by stacking a plurality of the first ceramic compacts.

The entire first ceramic compact 10A may have a tape shape. In this case, as shown in FIG. 5, a plurality of the first ceramic compacts 10A may be stacked, and a plurality of the patterned conductors 12 may be buried in a three dimensional structure.

In the first ceramic compact 10A, a part of the medium may remain in the slurry 18. In this case, the first ceramic compact 10A is flexible after the hardening step. Thus, even when a hard, brittle, thermosetting resin precursor is used as a binder, the formed flexible tape can be easily transported between process sections. Further, the stacking property of the stack of the first ceramic compacts 10A can be improved, and defects such as voids between the compacts are not generated. The pressure and temperature in the stacking step may be appropriately selected in view of the delamination, deformation, and displacement of the stack.

Figure 6A:
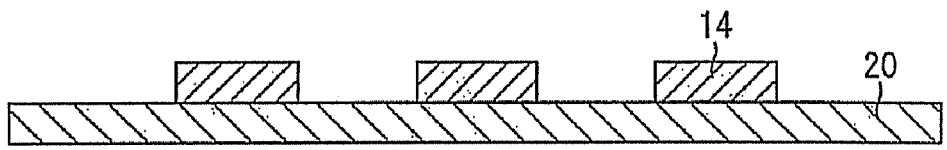
FIG. 6A is a cross-sectional view showing a pattern of a conductor paste formed on a film.
Figure 6B:
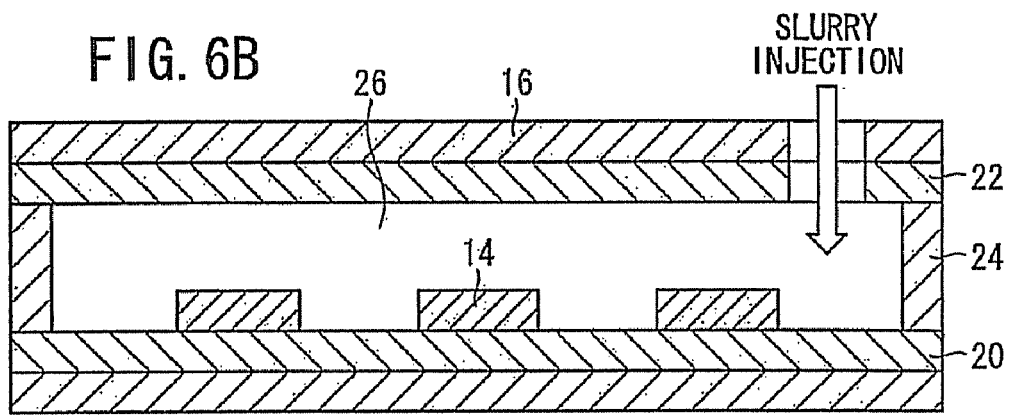
FIG. 6B is a cross-sectional view showing the film placed in a casting mold together with another film and a spacer.
Figure 6C:
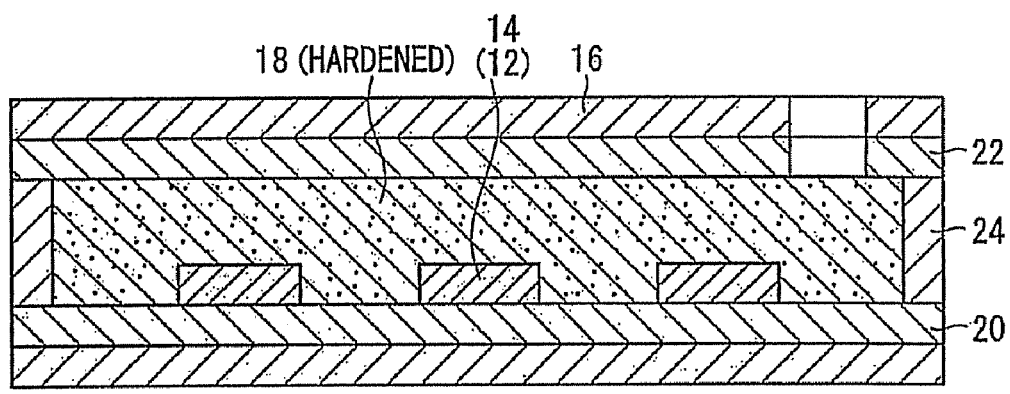
FIG. 6C is a cross-sectional view showing a slurry hardened in the casting mold.

The release of the first ceramic compact 10A from the casting mold 16 may be improved as shown in FIGS. 6A to 7B. Thus, as shown in FIG. 6A, the conductor paste 14 is printed into a pattern on the film 20, and then hardened to form the patterned conductor 12 on the film 20. As shown in FIG. 6B, the film 20 and another film 22 are stacked with a spacer 24 interposed therebetween in the casting mold 16 such that the conductor paste 14 faces the other film 22. Then, as shown in FIG. 6C, the slurry 18 is cast into a space 26 formed by the spacer 24, and then the slurry 18 is hardened to produce the first ceramic compact 10A. In this case, as shown in FIG. 7A, the first ceramic compact 10A is surrounded by the film 20, the other film 22, and the spacer 24, whereby the first ceramic compact 10A is not bonded to the casting mold 16 unnecessarily, and the first ceramic compact 10A can be easily released from the casting mold 16.

Figure 7A:
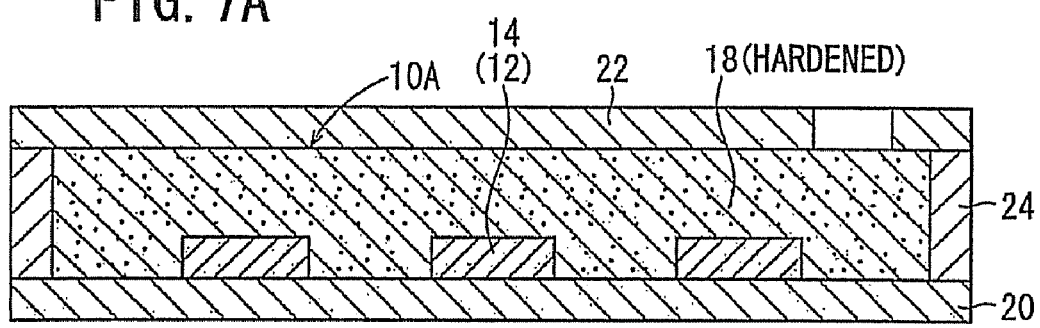
FIG. 7A is a cross-sectional view showing the ceramic compact, the film, the other film, and the spacer separated from the casting mold.
Figure 7B:
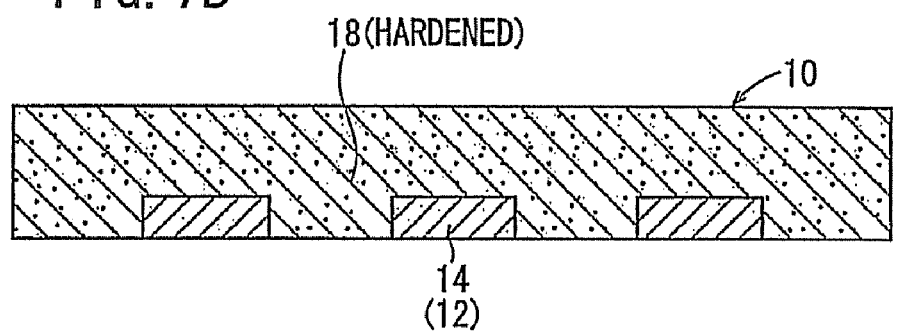
FIG. 7B is a cross-sectional view showing the ceramic compact separated from the film, the other film, and the spacer.

A release agent applied to the surface of the film 20, on which the patterned conductor 12 is formed, may be different in peel force from a release agent applied to the surface of the other film 22. In this case, the film 20 (or the other film 22) can be easily peeled off, and the first ceramic compact 10A can be easily released from the film 20 (or the other film 22). The first ceramic compact 10A released from the film 20, the other film 22, and the spacer 24 is shown in FIG. 7B.

A ceramic part according to the first embodiment (hereinafter referred to as a first ceramic part) can be produced by drying and then burning the first ceramic compact 10A.

In the first ceramic compact 10A (and a first stack 60) and the first ceramic part, the patterned conductor composed of the conductor paste (such as an electrode pattern) is not peeled off and not deformed, the thickness of the electrode pattern can be increased, the resistance value can be lowered, and the radio-frequency properties can be improved easily.

An example of the first ceramic compact 10A, the first ceramic part, the method for producing the first ceramic compact 10A, and the method for producing the first ceramic part will be described below with reference to FIGS. 8 to 10.

Figure 8:
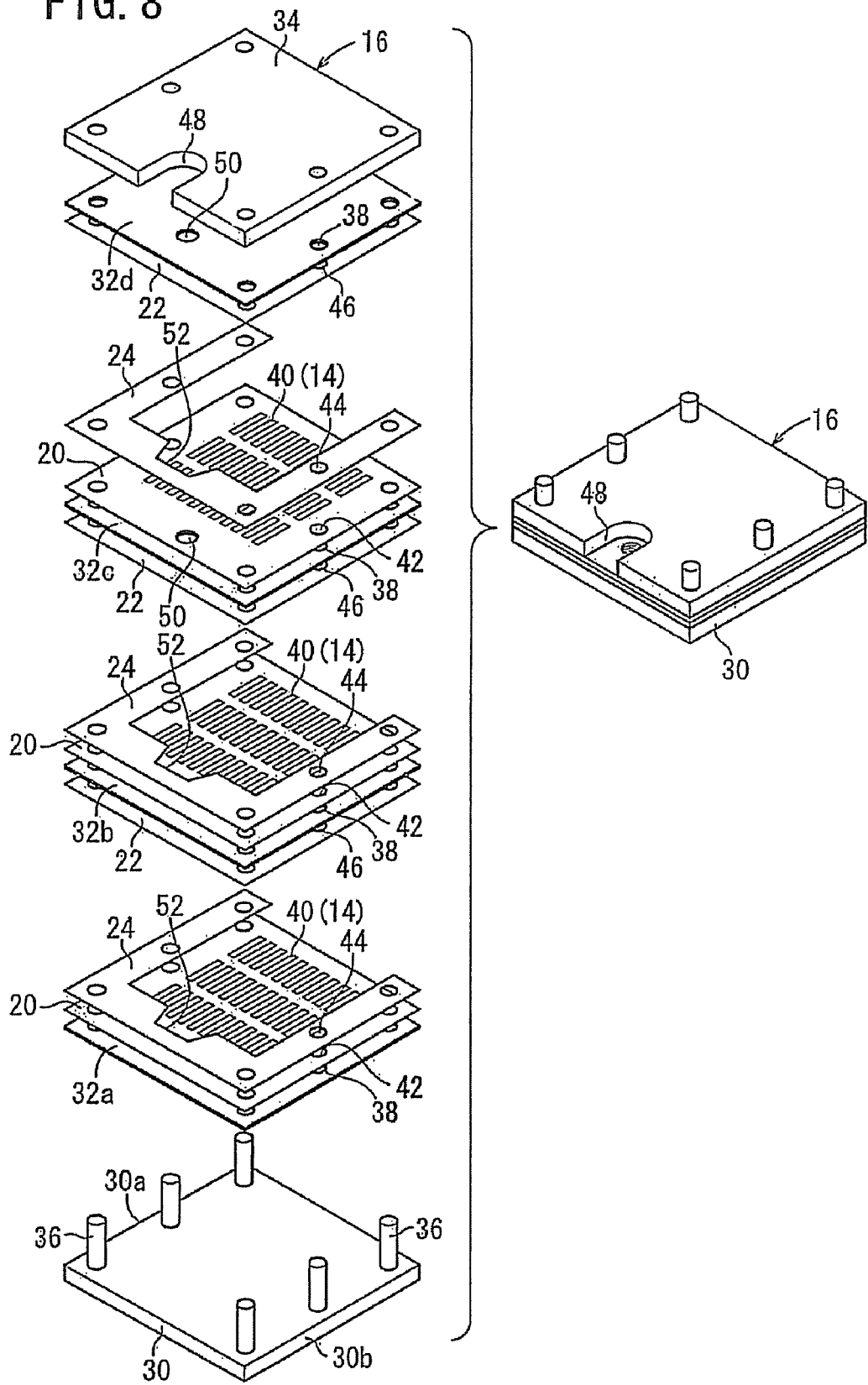
FIG. 8 is an exploded perspective view showing a casting mold for producing a first ceramic compact.

A casting mold 16 shown in FIG. 8 is used in this example. A plurality of first ceramic compacts 10A (for example three first ceramic compacts 10A) can be produced at once by using the casting mold 16.

As shown in FIG. 8, the casting mold 16 has one substrate 30, a plurality of plates (first to fourth plates 32a to 32d) placed on the substrate 30, and an upper plate 34 placed on the fourth plate 32d.

On the upper surface of the substrate 30, several rods 36 (for example three rods 36) are formed in the vicinity of a first side surface and in the vicinity of a second side surface (the opposite side surface) respectively. Each rod 36 is disposed on the upper surface of the substrate 30 such that the axial direction thereof is parallel to a normal line of the upper surface.

The first to fourth plates 32a to 32d and the upper plate 34 have through-holes for positioning (hereinafter referred to as positioning holes 38) at the positions corresponding to the rods 36 of the substrate 30. When the first to fourth plates 32a to 32d and the upper plate 34 are arranged on the substrate 30, the rods 36 of the substrate 30 are inserted through the positioning holes 38.

A stack of a first film 20, a spacer 24, and a second film 22 is interposed between the first plate 32a and the second plate 32b, between the second plate 32b and the third plate 32c, and between the third plate 32c and the fourth plate 32d, respectively. A plurality of electrode patterns 40 composed of the conductor paste 14 are formed on the upper surface of the first film 20.

The first film 20, the second film 22, and the spacer 24 are used to prevent the first ceramic compact 10A from unnecessarily bonding to the first to fourth plates 32a to 32d or the like in the casting mold 16. In particular, the lower surface shape of the first ceramic compact 10A depends on the first film 20, and the upper surface shape of the first ceramic compact 10A depends on the second film 22. The spacer 24 is substantially in a frame shape having an opening, and the area and height of the first ceramic compact 10A depends on the spacer 24. In the example of FIG. 8, the electrode patterns 40 on the first film 20 are surrounded on three sides by the spacer 24 having a frame shape. For example, the spacer 24 may be composed of the same material as the first film 20 and the second film 22. Each surface of the first film 20, the second film 22, and the spacer 24 is coated with a release agent, so that the produced first ceramic compact 10A can be easily separated therefrom.

The first film 20, the second film 22, and the spacer 24 have positioning holes 42, 46, and 44 at the positions corresponding to the rods 36 of the substrate 30, respectively.

A U-shaped notch 48 for injecting the slurry 18 is formed in the upper plate 34, and through-holes for injecting the slurry 18 (hereinafter referred to as injection holes 50) are formed in the second to fourth plates 32b to 32d at the positions corresponding to the U-shaped notch 48 respectively.

Also the first film 20, the second film 22, and the spacer 24 have a notch 52 and injection holes (some of them are not shown) at the positions corresponding to the injection holes 50 of the second to fourth plates 32b to 32d respectively.

For example, the casting mold 16 is assembled as follows.

First, the first plate 32a is placed on the upper surface of the substrate 30. In this step, the rods 36 of the substrate 30 are inserted into the positioning holes 38 of the first plate 32a respectively. The first film 20, the spacer 24, and the second film 22 are stacked on the first plate 32a. In this step, the rods 36 of the substrate 30 are inserted into the positioning holes 42, 44, and 46 of the first film 20, the spacer 24, and the second film 22 respectively. Then, in the same manner, the second plate 32b is placed thereon, the first film 20, the spacer 24 and the second film 22 are stacked on the second plate 32b, the third plate 32c is placed thereon, the first film 20, the spacer 24 and the second film 22 are stacked on the third plate 32c, the fourth plate 32d is placed thereon, and finally the upper plate 34 is placed thereon, to obtain the casting mold 16.

In the casting mold 16, a space surrounded by the first film 20, the spacer 24, and the second film 22 is formed between the first plate 32a and the second plate 32b, between the second plate 32b and the third plate 32c, and between the third plate 32c and the fourth plate 32d, respectively.

A method for producing the first ceramic compact 10A and the first ceramic part using the casting mold 16 will be described below with reference to FIGS. 9 and 10.

Figure 9:
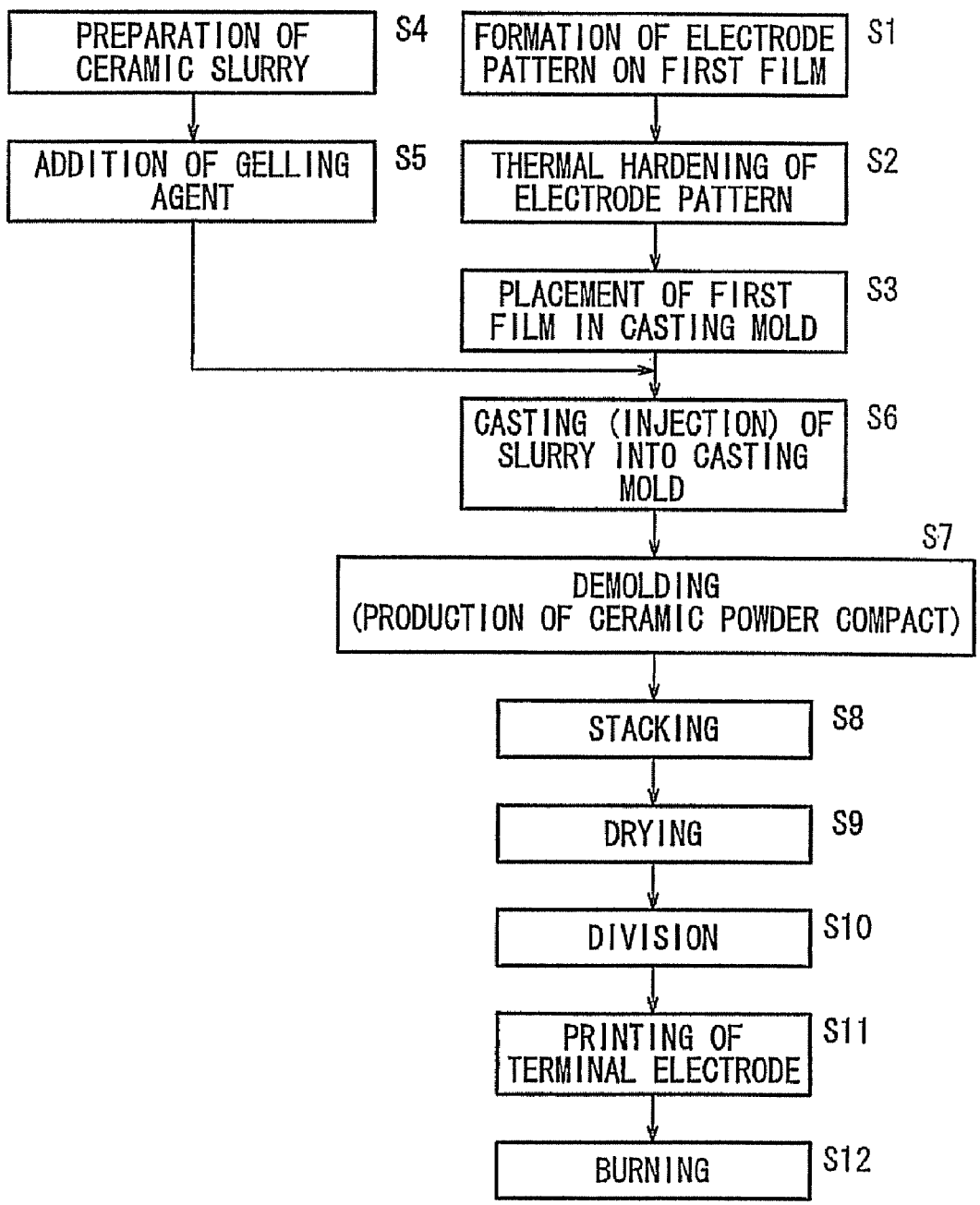
FIG. 9 is a block flow diagram of production of a first ceramic compact and a first ceramic part.

First, in the step S1 of FIG. 9, the conductor paste 14 is printed on the first film 20 to form a plurality of the electrode patterns 40.

Specifically, the first film 20 is a PET (polyethylene terephthalate) film coated with a silicone release agent. The first film 20 is subjected to an annealing treatment at 150° C. for 10 minutes or more to prevent shrinkage and warping in the step of thermally hardening the conductor paste 14.

Then, the positioning holes 42 are formed in the first film 20 to accurately stack the first film 20 in the casting mold 16. The conductor paste 14 is printed in predetermined portions on the upper surface of the first film 20, based on the positioning holes 42, to form the plurality of the electrode patterns 40. For example, the conductor paste 14 is a thermosetting-type silver (Ag) paste containing a resol-type phenolic resin. The particle size of the Ag powder used in the conductor paste 14 is controlled such that the shrinkage temperature property of the Ag powder is made close to that of a dielectric substance in the simultaneous burning step with the dielectric substance.

In the step S2 of FIG. 9, the electrode patterns 40 on the first film 20 are thermally hardened. Specifically, the electrode patterns 40 are subjected to a heat treatment at 120° C. for 1 hour to harden the thermosetting-type Ag paste.

In the step S3 of FIG. 9, the casting mold 16 is assembled, and the first film 20 having the electrode patterns 40 is placed together with the second film 22 and the spacer 24 in the casting mold 16. In the casting mold 16 of FIG. 8, the first film 20 is disposed between the first plate 32a and the second plate 32b, between the second plate 32b and the third plate 32c, and between the third plate 32c and the fourth plate 32d, respectively. Of course the spacer 24 and the second film 22 are stacked on the first film 20.

Meanwhile, in the steps S4 and S5 of FIG. 9, the slurry 18 to be injected to the casting mold 16 is prepared.

In the step S4, a ceramic slurry is prepared. The ceramic slurry contains a ceramic powder prepared by mixing a titanium oxide- or barium oxide-based powder with a sintering aid of a borosilicate glass. Specifically, the ceramic slurry is a mixture of 100 parts by weight of the ceramic powder and an organic dispersion medium, which contains 27 parts by weight of an aliphatic dibasic acid ester, 3 parts by weight of triacetin, and 3 parts by weight of polycarboxylic acid copolymer (an organic dispersing agent).

In the step S5, 1 to 10 parts by weight of a modified derivative of polymethylene polyphenyl polyisocyanate and 0.05 to 2.7 parts by weight of ethylene glycol are used as gelling agents, and 0.03 to 0.3 parts by weight of 6-dimethylamino-1-hexanol is used as a reaction catalyst. The agents are added to the above ceramic slurry, and the resulting mixture is stirred to prepare the slurry 18 (i.e., the gel casting slurry).

In the step S6, the slurry 18 is cast (injected) into the casting mold 16. Specifically, the slurry 18 is cast through the injection hole 50 of the fourth plate 32d, exposed in the U-shaped notch 48 of the upper plate 34 in the casting mold 16 (see FIGS. 8 and 10). Thus, a plurality of spaces in the casting mold 16 are filled with the slurry 18, respectively. The slurry 18 is a gel casting slurry, and thereby can be hardened without modification in the spaces. As a result, a plurality of the first ceramic compacts 10A (for example, three first ceramic compacts 10A) are produced in the casting mold 16.

In the step S7, the casting mold 16 is dismantled, and the first ceramic compact 10A is separated from the first film 20, the spacer 24, and the second film 22. Thus, the first ceramic compact 10A (a ceramic tape 10A) having the buried, patterned conductor 12 is completely produced (see FIG. 10).

Figure 10:
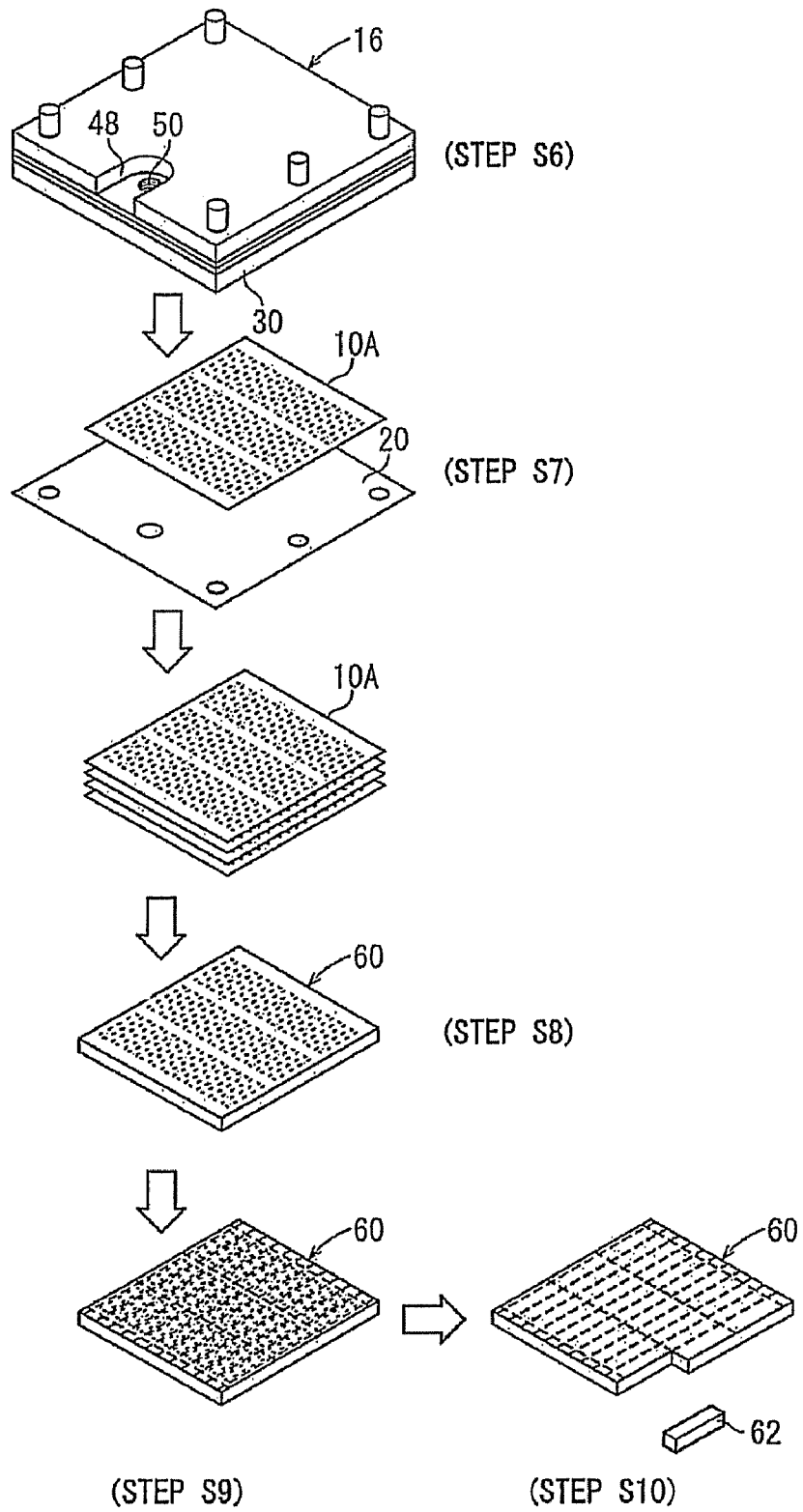
FIG. 10 is an explanatory view showing procedures of the steps S6 to S10 of FIG. 9.

Then, in the step S8 of FIG. 9, a plurality of the ceramic tapes 10A are stacked to obtain a first stack 60 (see FIG. 10). Reactive functional groups of the ceramic tapes 10A are not completely reacted at room temperature 1 to 48 hours after the casting. The ceramic tapes 10A are pressed in this state at a pressure of 5 to 100 kgf/cm$^2$. The pressure is appropriately selected depending on the strength of the ceramic tapes 10A and the acceptable stacking error.

When the pressure is too low in the stacking step, delamination is often caused in the burned product due to bonding failure, though the undesirable displacement of the stack is reduced. On the other hand, when the pressure is too high in the stacking step, the ceramic tapes 10A is often deformed or broken by the pressure, though the delamination is prevented. When the pressure is within the above range, the displacement and the delamination can be preferably prevented. After the above pressing at 5 to 100 kgf/cm$^2$, the ceramic tapes 10A may be further pressed at 50 to 400 kgf/cm$^2$ to improve the integrity, if necessary.

In this step, remaining reactive components in the adjacent ceramic tapes 10A are reacted to improve the bonding between the ceramic tapes 10A. From the viewpoint of reducing the time required for the hardening reaction, it is preferred that the ceramic tapes 10A are stacked under heating at 60° C. to 80° C.

In view of producing the first stack 60 under a lower pressure, it is preferred that an adhesion layer is applied and printed on each tape in the stacking step. The adhesion layer may contain the same components as those of the above hardening slurry, but the reaction catalyst is not needed in the adhesion layer. The hardening reaction of the adhesion layer can be completed in a practically acceptable time due to the reaction catalyst remaining in the ceramic tapes 10A.

It is also preferred that the sufficiently hardened or dried ceramic tapes 10A are stacked after applying or printing an adhesive paste onto the ceramic tapes 10A. The adhesive paste may be prepared by mixing an inorganic powder equal to those in the ceramic tapes 10A, a butyral resin, an acrylic resin, a butyl carbitol acetate medium, and/or an organic medium such as an aliphatic dibasic acid ester.

The adhesion between the ceramic tapes 10A can be improved in the above manner to prevent the delamination. When the adhesive paste is used, a medium may remain in the reaction hardened tape, and may be removed by drying at 60° C. to 100° C. In the case of removing the medium, the resultant reaction hardened tape is poor in plasticity, and thereby is difficult to handle. Therefore, it is preferred that 1 to 10 parts by weight of a plasticizer (DOP or DBP) is added to the unhardened slurry to improve the plasticity of the dried ceramic tape 10A.

The first stack 60 is dried in the step S9 of FIG. 9, and then is divided into a plurality of chips 62 in the step S10 as shown in FIG. 10.

In the step S11, a terminal electrode is formed by printing on the upper or side surface of each chip 62.

In the step S12, each chip 62 is burned to produce a burned ceramic body having a buried conductor according to the example.

A preferred embodiment of the components will be described below.

[Conductor Paste 14: First Embodiment]

The conductor paste 14 preferably contains an unhardened binder of an epoxy resin, a phenol resin, or the like, particularly preferably contains a resol-type phenolic resin. The metal powder may be composed of a single substance, an alloy, or an intermetallic compound of a metal such as Ag, Pd, Au, Pt, Cu, Ni, or Rh. The metal may be appropriately selected depending on the properties of the ceramic to be simultaneously burned, i.e., oxygen partial pressure, temperature, and shrinkage temperature property in the burning, etc. The shrinkage temperature property depends not only on the composition of the metal powder, but also on the particle diameter, specific surface area, and aggregation of the metal powder. For example, in the case of using an Ag powder, the weight ratio of the binder to the metal powder in the conductor paste 14 may be 1% to 10%. The weight ratio is preferably selected within the range of 3% to 6% in view of the burning shrinkage ratio and the screen printing property of the ceramic.

As described above, the conductor paste 14 is printed and then hardened under heating. The hardening conditions may be controlled depending on the type of a hardening agent. For example, the resol-type phenolic resin used in the first embodiment is hardened at 120° C. for 10 to 60 minutes.

After the electrode pattern 40 of the conductor paste 14 is hardened, the first film 20 (the PET film) having the hardened electrode pattern 40 is placed in the casting mold 16. In this placement step, the PET film is adsorbed to a template having desired parallelization degree and flatness (one of the first to third plates 32a to 32c) by vacuum adsorption, paste bonding, electrostatic adsorption, etc. to prevent warping of the PET film.

[Casting Mold 16 (Metal Mold): First Embodiment]

The template (one of the first to third plates 32a to 32c) may be a plate suitable for the adsorption method. For example, in the case of using the vacuum adsorption, the template may be a porous plate or a plate having a number of adsorption pores regardless of the materials such as metals, ceramics, and resins. In the case of using the paste bonding, the template may be composed of a material that is not reacted with the paste and is not deteriorated in the process of wiping off the paste with a solvent, etc. In the case of using the electrostatic adsorption, the template is preferably composed of a material to which the PET is easily electrostatically-adsorbed.

The casting mold 16 has a flow path for the slurry 18 inside. It is preferred that the first film 20 having the electrode pattern 40, the second film 22 (having or not having an electrode pattern), and the spacer 24 are placed between the templates, the first film 20 is parallel to the second film 22, and an appropriate space is formed between the first film 20 and the second film 22, whereby the slurry 18 has a plate shape with a desired thickness after the casting and hardening steps.

The first film 20, the second film 22, and the spacer 24 may be a PET film, a metal or ceramic plate coated with a release agent, a TEFLON (trade mark) resin plate, or the like, respectively.

The slurry 18, which contains the resin to be reaction-hardened, is cast into the casting mold 16, and then hardened.

[Slurry 18: First Embodiment]

The slurry 18 contains an inorganic component of a ceramic powder, and examples of the ceramics include oxide ceramics (such as aluminas, stabilized zirconias, piezoelectric ceramics, and dielectric ceramics), nitride ceramics (such as silicon nitrides and aluminum nitrides), and carbide ceramics (such as silicon carbides and tungsten carbides). The inorganic component may contain a glass as a binder. The slurry 18 may contain an organic compound for accelerating a chemical reaction between a dispersing agent and a gelling agent or between gelling agent molecules. The components may be selected in accordance with the intended use.

Further, the slurry 18 contains an organic dispersion medium and a gelling agent in addition to the inorganic component powder, and may contain a dispersing agent or a catalyst for controlling the viscosity or the solidification. The organic dispersion medium particularly preferably has a reactive functional group, though it may have no reactive functional groups.

Examples of the organic dispersion media having a reactive functional group are described below.

The organic dispersion medium having a reactive functional group is a liquid satisfying two conditions that it can be chemically bonded to a gelling agent to solidify the slurry 18 and that it can form a high-fluidity, easily castable slurry 18.

To achieve the chemical bonding to the gelling agent and the solidification of the slurry 18, the organic dispersion medium must have a reactive functional group capable of being chemically bonded to the gelling agent, such as a hydroxyl group, a carboxyl group, or an amino group, in the molecule. The organic dispersion medium has at least one reactive functional group, and it is preferred that the organic dispersion medium has two or more reactive functional groups from the viewpoint of solidifying the slurry 18 more sufficiently. Examples of such liquid materials having two or more reactive functional groups include polyalcohols and polybasic acids. The two or more reactive functional groups in the molecule may be the same or different groups. The organic dispersion medium such as a polyglycerol may have a plurality of reactive functional groups.

To prepare a high-fluidity slurry 18 that can be easily cast, the viscosity of the organic dispersion medium is preferably as low as possible. It is particularly preferred that the organic dispersion medium has a viscosity of 20 cps or less at 20° C. Though the above polyalcohols and polybasic acids can solidify the slurry 18, they show a high viscosity due to the hydrogen bond formed and thereby are not preferred in some cases. Thus, ester compounds having two or more ester groups, such as polybasic acid esters and polyalcohol acid esters, are preferably used as the organic dispersion medium. The polyalcohols and polybasic acids can be effectively used for increasing the strength of the slurry 18 in such a small amount that the viscosity of the slurry 18 is not greatly increased. Though the ester compounds are relatively stable, they can be reacted with a high-reactive gelling agent. The ester compounds are low in viscosity, and thus satisfy the above two conditions. Esters having a carbon number of 20 or less are low in viscosity, and thereby are particularly preferably used as the reactive dispersion medium.

Specific examples of the organic dispersion media having a reactive functional group for the slurry 18 include nonionic esters, alcohol ethylene oxides, condensed amines, particular nonionic amides, modified polyesters, carboxyl-containing polymers, polyanionic maleic compounds, polycarboxylic esters, nonionic multichain polymers, phosphate esters, sorbitan fatty acid esters, sodium alkylbenzene sulfonates, and maleic compounds. Examples of unreactive dispersion media include hydrocarbons, ethers, and toluene.

[Gelling Agent: First Embodiment]

The gelling agent in the slurry 18 is reacted with the reactive functional group of the dispersion medium to cause the solidification reaction. Examples of such gelling agents are described below.

The gelling agent preferably has a viscosity of 3000 cps or less at 20° C. Specifically, it is preferred that a gelling agent having an isocyanate group and/or an isothiocyanate group is chemically bonded to an organic dispersion medium having two or more ester groups, to solidify the slurry 18.

The reactive gelling agent can be chemically bonded to the dispersion medium to solidify the slurry 18. The gelling agent may be any substance as long as it has a reactive functional group capable of being chemically reacted with the dispersion medium in the molecule. The gelling agent may be a monomer, an oligomer, or a prepolymer that can be three-dimensionally crosslinked by adding a crosslinking agent (such as a polyvinyl alcohol, an epoxy resin, or a phenol resin).

The reactive gelling agent preferably has a low viscosity, specifically a viscosity of 3000 cps or less at 20° C., in view of obtaining a sufficient fluidity of the slurry 18.

In general, the prepolymer and the polymer with a high average molecular weight are high in viscosity. In this example, the monomer or oligomer having a molecular weight smaller than those of the prepolymer and polymer, specifically an average molecular weight of 2000 or less (measured by a GPC method), is preferably used as the gelling agent. The term "viscosity" used herein means the viscosity of the gelling agent per se (the viscosity of 100% pure gelling agent), and does not mean the viscosity of a commercially available, diluted gelling agent solution (such as an aqueous gelling agent solution).

It is preferred that the reactive functional group of the gelling agent is appropriately selected depending on the reactivity with the reactive dispersion medium. For example, in the case of using a relatively low-reactive ester as the reactive dispersion medium, the gelling agent preferably has an isocyanate group ($-N=C=O$) and/or an isothiocyanate group ($-N=C=S$) with high reactivity.

The isocyanate compound is generally reacted with a diol or diamine compound. However, the diol compound often has a high viscosity as described above, and the diamine compound often has an excessively high reactivity and thereby solidifies the slurry 18 before the casting.

In these respects, it is preferred that the slurry 18 is solidified by a reaction between the reactive ester dispersion medium and the isocyanate- and/or isothiocyanate-containing gelling agent. It is more preferred that the slurry 18 is solidified by a reaction between the reactive dispersion medium having two or more ester groups and the isocyanate- and/or isothiocyanate-containing gelling agent. The diol and diamine compounds can be effectively used for increasing the strength of the slurry 18 in such a small amount that the viscosity of the slurry 18 is not greatly increased.

Examples of the isocyanate- and/or isothiocyanate-containing gelling agents include MDI (4,4'-diphenylmethane diisocyanate)-type isocyanates (resins), HDI (hexamethylene diisocyanate)-type isocyanates (resins), TDI (tolylene diisocyanate)-type isocyanates (resins), IPDI (isophorone diisocyanate)-type isocyanates (resins), and isothiocyanates (resins).

In view of the chemical properties of the gelling agent, such as the compatibility to the reactive dispersion medium, it is preferred that another functional group is introduced to the above basic chemical structure of the gelling agent. For example, in the case of using the reactive ester dispersion medium, a hydrophilic functional group is preferably introduced to increase the compatibility to the ester and the homogeneity of the mixture.

The gelling agent may have a reactive functional group other than the isocyanate group and the isothiocyanate group, and may have both of the isocyanate group and the isothiocyanate group, in the molecule. Further, the gelling agent may be a compound having a plurality of reactive functional groups, such as a polyisocyanate.

The slurry 18, to be applied to the material and contact surface of the first ceramic compact 10A, may contain an additive such as a defoamer, a surfactant, a sintering aid, a catalyst, a plasticizer, or a property improver in addition to the above components.

The slurry 18 may be prepared as follows: (1) the inorganic powder is dispersed in the dispersion medium, and then the gelling agent is added thereto; or (2) the inorganic powder and the gelling agent are simultaneously added to and dispersed in the dispersion medium.

The viscosity of the slurry 18 at 20° C. is preferably 30000 cps or less, more preferably 20000 cps or less, in view of workability in the casting and application steps. The viscosity of the slurry 18 can be controlled by changing the viscosity of the reactive dispersion medium or the gelling agent, the type of the powder, the amount of the dispersing agent, or the concentration of the slurry 18 (the volume ratio of the powder to the entire slurry 18).

In general, it is preferred that the slurry 18 has a concentration of 25% to 75% by volume. From the viewpoint of reducing cracking due to shrinkage in the drying step, it is more preferred that the slurry 18 has a concentration of 35% to 75% by volume. The slurry 18 may contain the organic components of the dispersion medium, the dispersing agent, the reaction hardening component, and the reaction catalyst. For example, the slurry 18 may be solidified by a chemical reaction between the dispersion medium and the gelling agent or between the gelling agent molecules.

Second Embodiment

A ceramic compact according to a second embodiment (hereinafter referred to as a second ceramic compact 10B) will be described below with reference to FIGS. 11 to 15.

Figure 11:
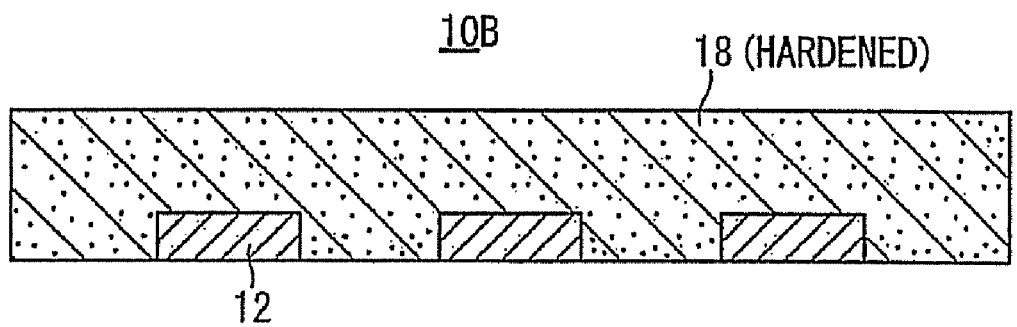
FIG. 11 is a cross-sectional view showing a second ceramic compact.

As shown in FIG. 11, the second ceramic compact 10B is obtained by coating a patterned conductor 12 with a slurry 18 and by hardening the slurry 18, and the slurry 18 is prepared by mixing a thermosetting resin precursor, a ceramic powder, and a medium. In a case where the second ceramic compact 10B has a small thickness (for example, 0.05 mm or less), it is difficult to produce the second ceramic compact 10B by a casting method using a mold. In this case, the second ceramic compact 10B is preferably produced by applying the slurry 18 to a base.

A specific method for producing the second ceramic compact 10B and a second ceramic part will be described below with reference to FIGS. 12A to 14C.

Figure 12A:
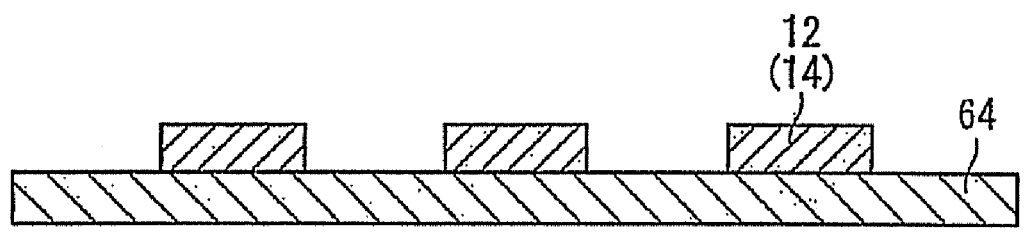
FIG. 12A is a view showing a process of forming a conductor paste into a pattern on a base and hardening the conductor paste to form a patterned conductor.

First, as shown in FIG. 12A, a release agent (not shown) is applied to the upper surface of a base 64 such as a film, a conductor paste 14 is formed into a pattern by a printing method or the like on the upper surface, and then the patterned conductor paste 14 is thermally hardened to form the patterned conductor 12 on the base 64.

Figure 12B:
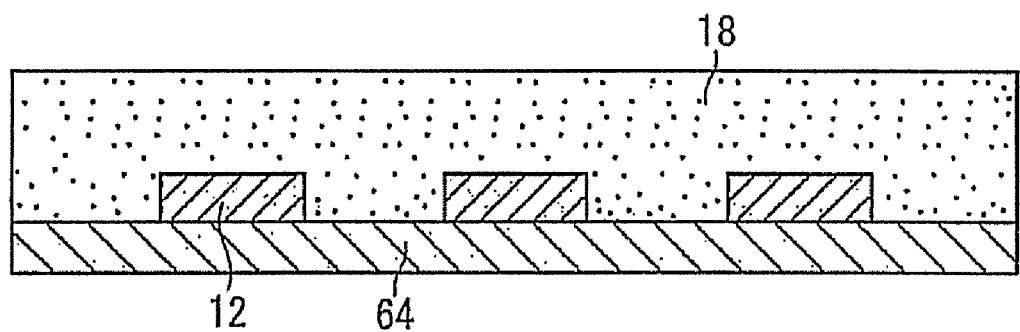
FIG. 12B is a view showing a process of applying a slurry to the base, thereby coating the patterned conductor with the slurry.

Next, as shown in FIG. 12B, the slurry 18 prepared by mixing the thermosetting resin precursor, the ceramic powder, and the medium is applied to the base 64 such that the patterned conductor 12 is coated with the slurry 18. The slurry 18 may be applied by a dispenser method, a method shown in FIGS. 13A and 13B, a spin coating method, etc. In the method shown in FIGS. 13A and 13B, the base 64 having the patterned conductor 12 is placed between a pair of guide plates 66a and 66b, the slurry 18 is applied to the base 64, thereby coating the patterned conductor 12 with the slurry 18, and a blade jig 68 is slid on the upper surfaces of the guide plates 66a and 66b to remove excess slurry 18. The thickness of the slurry 18 can be easily controlled by changing the height of the guide plates 66a and 66b.

Figure 14A:
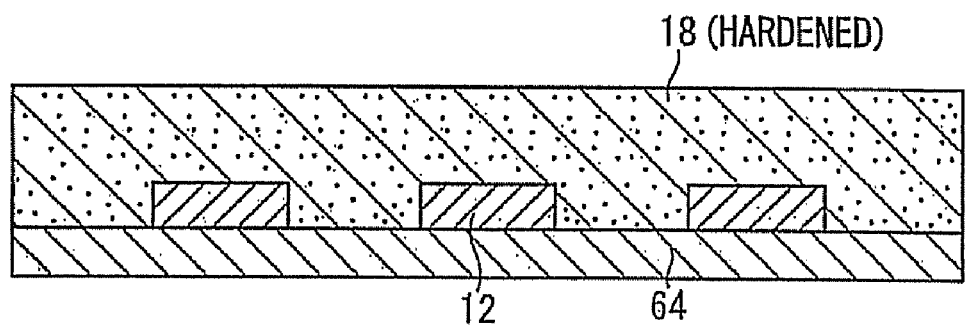
FIG. 14A is a view showing a process of hardening the slurry applied to the base.

As shown in FIG. 14A, the slurry 18 applied to the base 64 is hardened at room temperature, a drying temperature, etc.

Figure 14B:
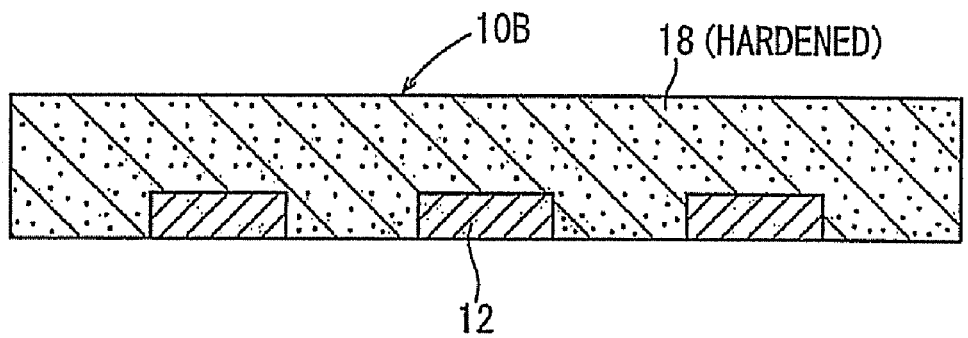
FIG. 14B is a view showing a process of removing the base to obtain the second ceramic compact.

As shown in FIG. 14B, the base 64 is peeled off and removed from to obtain the second ceramic compact 10B.

Figure 14C:
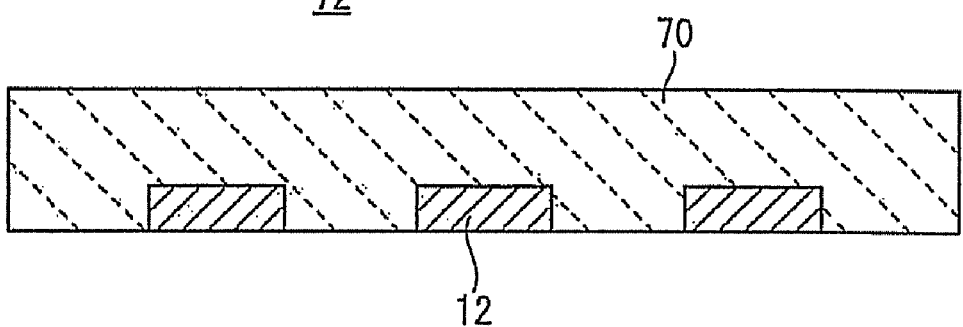
FIG. 14C is a view showing a process of burning the second ceramic compact to obtain a second ceramic part.

Further, as shown in FIG. 14C, the second ceramic compact 10B is burned to obtain a second ceramic part 72 having a burned ceramic body 70 and the buried patterned conductor 12.

A preferred embodiment of the components will be described below.

[Conductor Paste 14: Second Embodiment]

Since the conductor paste 14 of the second embodiment is substantially equal to that of the first embodiment, duplicate explanations therefor are omitted. In the second embodiment, the conductor paste 14 contains a resin and a powder of at least one metal selected from silver (Ag), gold (Au), and copper (Cu) series metals. The resin in the conductor paste 14 is preferably a thermosetting resin precursor. In this case, the thermosetting resin precursor is preferably a self-reactive, resol-type phenolic resin.

As described above, the conductor paste 14 is printed and then hardened under heating. The hardening conditions may be controlled depending on the type of a hardening agent. For example, the resol-type phenolic resin used in the second embodiment is hardened at 80° C. to 150° C. for 10 to 60 minutes.

[Slurry 18: Second Embodiment]

Since the slurry 18 of the second embodiment is substantially equal to that of the first embodiment, duplicate explanations therefor are omitted. In the slurry 18 of the second embodiment, examples of the components of the ceramic powder include oxide ceramics (such as aluminas, stabilized zirconias, piezoelectric ceramics, and dielectric ceramics), nitride ceramics (such as silicon nitrides and aluminum nitrides), carbide ceramics (such as silicon carbides and tungsten carbides), and binder glass components. The components may be selected in accordance with the intended use.

The thermosetting resin precursor in the slurry 18 contains a gelling agent having an isocyanate group or an isothiocyanate group, and a polymer having a hydroxyl group.

Figure 13A:
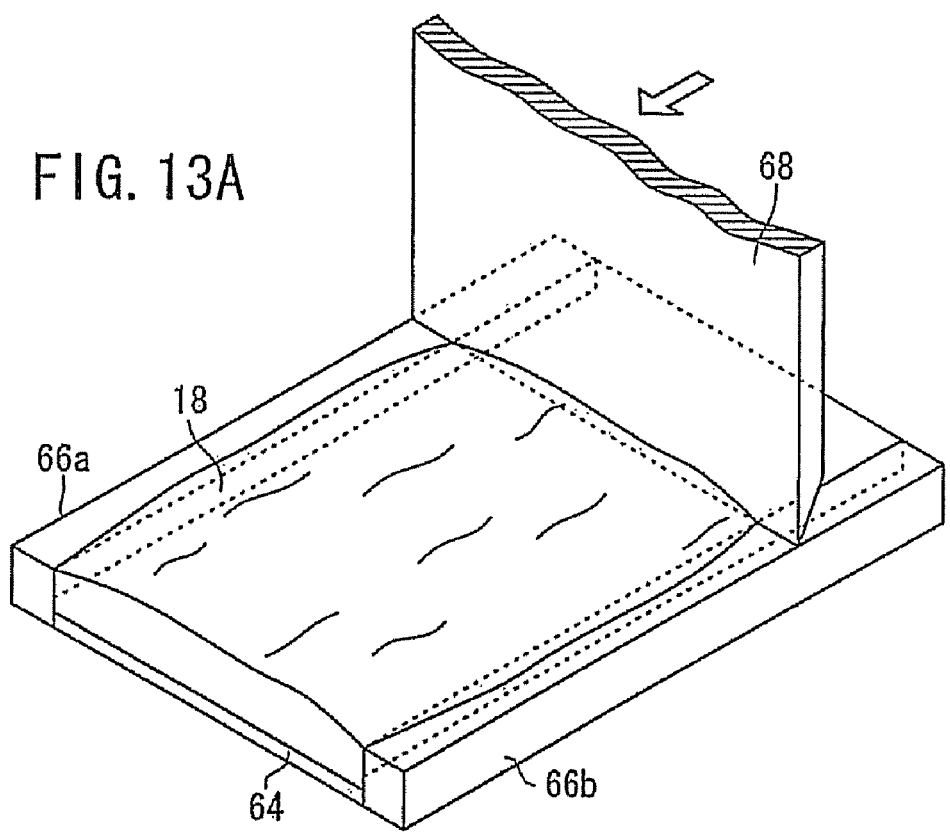
FIG. 13A is a perspective view showing a method of applying the slurry to the base.
Figure 13B:
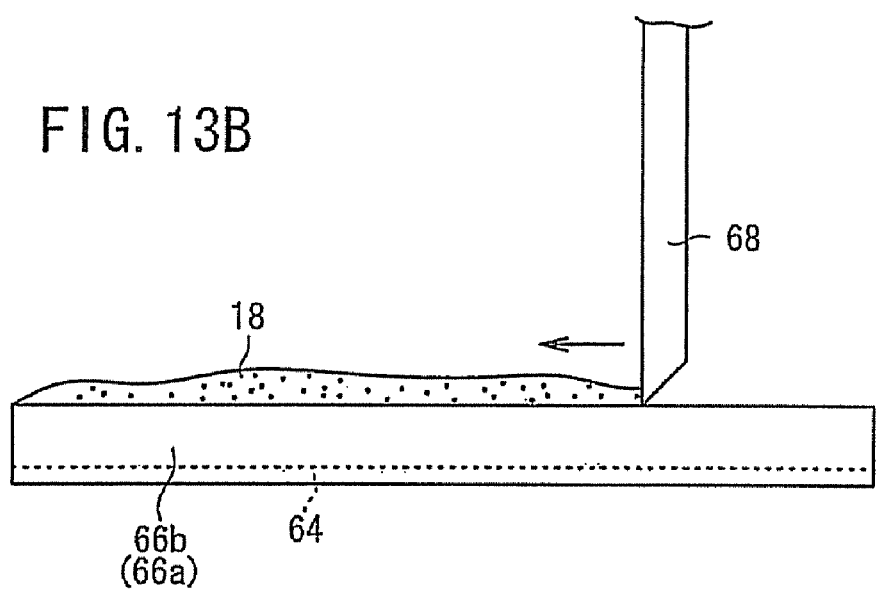
FIG. 13B is a side view showing the method.

In a case where the slurry 18 is applied to the base 64 by the dispenser method or the method shown in FIGS. 13A and 13B, it is preferred that the slurry 18 has a relatively high viscosity. The viscosity of the slurry 18 of the second embodiment may be equal to that of the first embodiment. However, when the slurry 18 has a too low viscosity in the second embodiment, the applied slurry 18 is poor in shape retention property and easily flows, resulting in uneven thickness. Thus, in the second embodiment, the viscosity of the slurry 18 is preferably 200 to 2000 cps.

The viscosity of the slurry 18 may be increased by using a high-molecular resin as the polymer having a hydroxyl group. For example, a butyral resin having a high molecular weight can be preferably used to increase the viscosity of the slurry 18. Since the viscosity of the slurry 18 can be controlled by changing the molecular weight of the hydroxyl-containing polymer, the resin used as the polymer may be appropriately selected depending on the application method.

The above butyral resin is generally a polyvinyl acetal resin derived from a polyvinyl alcohol resin. It is believed that an OH group of the polyvinyl alcohol resin remains in the polyvinyl acetal resin, and is reacted with the isocyanate or isothiocyanate group of the gelling agent.

Figure 15:
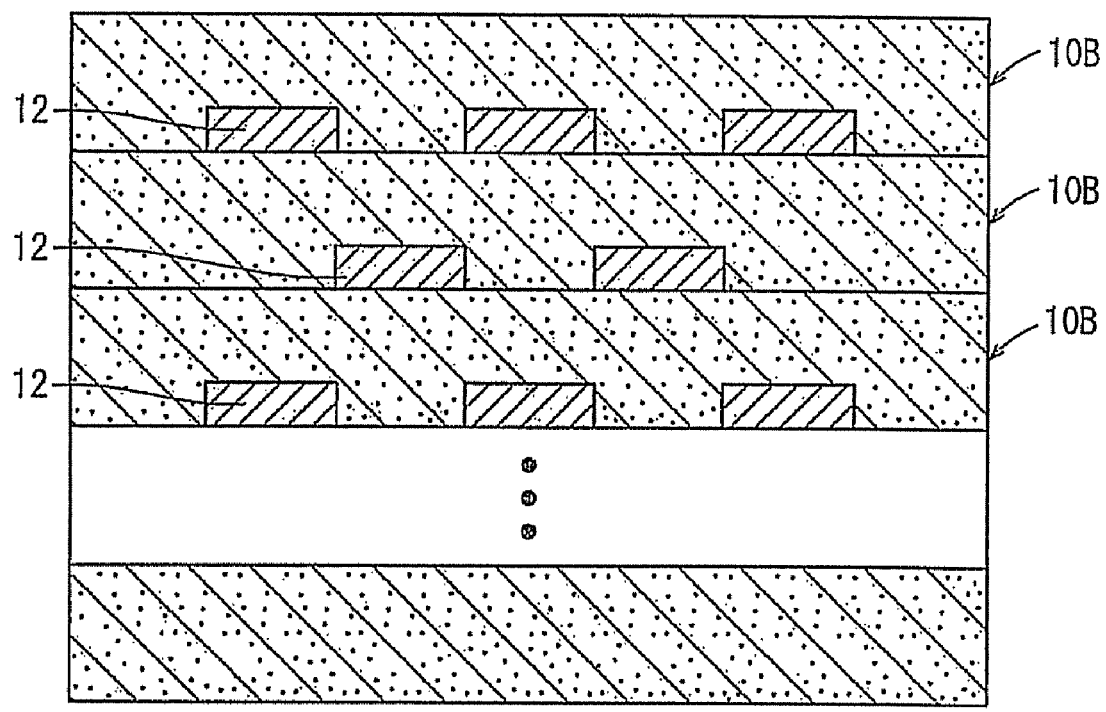
FIG. 15 is a cross-sectional view showing a second stack produced by stacking a plurality of the second ceramic compacts.

Particularly in a case where the amount of the butyral resin is larger than the stoichiometric amount required for the reaction with the isocyanate or isothiocyanate group, the residual butyral resin acts as a thermoplastic resin after the reaction. In general, when a thermosetting resin is hardened, the adhesion thereof is deteriorated. The deterioration can be reduced by the residual butyral resin. Thus, in this case, in production of a second stack 74 by stacking a plurality of the second ceramic compacts 10B as shown in FIG. 15, the adhesion between the second ceramic compacts 10B in the production process is improved, and the peeling of the second ceramic compact 10B is prevented, so that the yield of the ceramic part 72 using the second stack 74 of the second ceramic compacts 10B can be increased.

Other preferred examples of the hydroxyl-containing polymers include ethylcellulose-based resins, polyethyleneglycol-based resins, polyether-based resins, polypropyleneglycol-based resins, polyester-based resins, and polycarbonate-based resins.

In the second ceramic compact 10B (and the second stack 74) and the second ceramic part 72, the patterned conductor 12 composed of the conductor paste 14 (such as an electrode pattern) is not peeled off and not deformed, the thickness of the patterned conductor 12 can be increased, the resistance value can be lowered, and the radio-frequency properties can be improved easily.

Problems of conventional ceramic part precursors using thermoplastic resins and resolutions using the first ceramic compact 10A or the second ceramic compact 10B (which may be referred to as the ceramic compact of the present invention) will be described below.

When a slurry containing a thermoplastic resin for the conventional ceramic part precursor is dried and shrunk, a boundary surface of the slurry and a patterned conductor is often gapped or cracked, and a green sheet is often warped.

In the present invention, the above problem is solved such that the slurry 18 contains the thermosetting resin precursor, and the thermosetting resin precursor is hardened in the drying step to form a three dimensional network structure, whereby the shrinkage is reduced so that the above problems are solved.

In this case, it is preferred that the medium for the slurry 18 exhibits a low vapor pressure at a temperature for hardening the thermosetting resin precursor, so that the shrinkage due to the removal of the medium is lowered in the thermal hardening step. Particularly a resin, which is hardened at room temperature, can be easily treated using a simple apparatus.

A polyurethane resin is advantageous in that the elasticity of the hardened resin can be easily controlled, and that a flexible compact can be easily produced. A hard compact is not suitable for handling in a post-process in some cases. Though the thermosetting resin having the three-dimensional network structure is generally hard, the polyurethane resin can provide a flexible compact. A formed tape is often required to have a flexibility, and the polyurethane resin is particularly preferably used for forming such a tape. Further, a thermoplastic resin may be added to the slurry 18 to control the properties of the slurry 18. The polyurethane resin is defined as a resin prepared by a crosslinking reaction of an isocyanate group or an isothiocyanate group. The polyurethane resin may have a urethane group, a urea group, an allophanate group, a biuret group, or the like, and may be used singly or in combination with another resin.

In conventional methods, when the slurry is applied, a conductor paste containing a thermoplastic resin is dissolved in a medium of the slurry, and the pattern is deformed.

In the present invention, since the conductor paste 14 contains the thermosetting resin precursor, the medium resistance of the conductor paste 14 is improved, and the pattern is not deformed.

The thermosetting resin precursor irreversibly forms the three dimensional network structure in the hardening step. After the hardening step, the thermosetting resin precursor is not soluble in the medium. In general, the thermosetting resin precursor is higher in solvent resistance than the thermoplastic resin.

The thermosetting resin precursor is preferably a phenol resin, an epoxy resin, or a polyester resin. The preferred resins are advantageous in that the molecular weight of an unhardened prepolymer and the properties of a paste can be controlled. A thermoplastic resin may be used in combination with the thermosetting resin to control the paste properties.

Particularly an epoxy resin and a phenol resin can be hardened by heating without hardening agents, and are suitable for efficient use of the conductor paste 14. Another thermosetting resin precursor has to be used in combination with a hardening agent. Although the hardening agent should be mixed with the thermosetting resin precursor before the conductor paste 14 is printed, and the mixture cannot be stored. Thus, in a case where the residual conductor paste 14 is recovered and stored after the printing, the thermosetting epoxy or phenol resin that can be hardened without hardening agents are preferably used.

Because the conventional ceramic compact using the thermoplastic resin as a binder often has density unevenness, the burned ceramic body has a large dimensional unevenness, and the burned, buried patterned conductor has a large dimensional unevenness. The properties and functions of an electronic part often depend on the dimension of a conductor. For example, the center frequency of a strip line filter having a built-in conductor depends on the dimension of a resonant electrode.

In the present invention, the thermosetting resin precursor is used as the binder for producing the first ceramic compact 10A or the second ceramic compact 10B having the buried patterned conductor 12, so that the burning unevenness can be reduced.

For example, the dimension of the burned second ceramic compact 10B mainly depends on the green densities of portions other than the patterned conductor 12. The burned ceramic body 70 of the second ceramic part 72 has only a few spaces. In contrast, the above portions of the ceramic compact 10B have a large number of spaces, and the shrinkage in the burning step depends on the volume of the spaces.

The medium in the slurry 18 containing the thermoplastic resin as a binder is removed to obtain the ceramic compact 10A, 10B. The application volume ratio of the slurry to the ceramic compact is high, and the density unevenness is increased due to the high application ratio.

In the present invention, the thermosetting resin precursor is used as the binder, so that the slurry 18 can be hardened without removing the medium. Therefore, the application ratio can be lowered, and the green density unevenness can be reduced. As a result, the dimensional unevenness of the burned ceramic body can be reduced, and further the dimensional unevenness of the buried patterned conductor 12 can be reduced.

Third Embodiment

A ceramic compact according to a third embodiment has substantially the same structure as the first ceramic compact 10A and the second ceramic compact 10B except for a few components of the slurry 18.

In the third embodiment, a polybasic acid ester having two or more ester groups is used as the dispersion medium, and an isocyanate- or isothiocyanate-containing gelling agent and a hydroxyl-containing polymer or molecular substance are used as the thermosetting resin precursor. A small amount of water may also be added.

The isocyanate group reacted with water forms a carbamic acid to generate an amine and carbon dioxide, and the amine is reacted with another isocyanate group to form a urea group. The urea group is further reacted with another isocyanate group to form a crosslinked biuret structure. In the case of adding water, carbon dioxide (gas) is generated. When the slurry 18 is hardened in this state, the gas forms pores. Thus, it is preferred that, after mixing the slurry 18, the reaction gas is removed from the slurry 18 by a vacuum degassing method, etc.

Fourth Embodiment

A ceramic compact according to a fourth embodiment has substantially the same structure as the first ceramic compact 10A and the second ceramic compact 10B except for a few components of the slurry 18.

In the fourth embodiment, a medium having no or low reactivity with the gelling agent is used as the dispersion medium, and an isocyanate- or isothiocyanate-containing gelling agent and a hydroxyl-containing polymer or molecular substance is used as the thermosetting resin precursor. A small amount of water may also be added.

Fifth Embodiment

A ceramic compact according to a fifth embodiment has substantially the same structure as the first ceramic compact 10A and the second ceramic compact 10B except for a few components of the slurry 18.

In the fifth embodiment, a medium having no or low reactivity with the gelling agent is used as the dispersion medium, and an isocyanate- or an isothiocyanate-containing gelling agent and water are used as the thermosetting resin precursor.
[Others]

In the above second, third, fourth, and fifth embodiments, the composition of the slurry 18 may be such that the hydroxyl group is reacted with an excessive amount of the isocyanate or isothiocyanate group.

It is a matter of course that the ceramic compact, the ceramic part, the ceramic compact producing method, and the ceramic part producing method according to the present invention are not limited to the embodiments described above, which may be embodied in other various forms without deviating from the essential characteristics of the present invention.

What is claimed is:

1. A method for producing a ceramic compact, comprising:
a conductor forming step of forming a patterned conductor;
a slurry supplying step of coating said patterned conductor with a slurry prepared by mixing a thermosetting resin precursor, a ceramic powder, and a medium;
a slurry hardening step of hardening said slurry,
wherein said patterned conductor is formed on a film, in said conductor forming step,
wherein said film having said patterned conductor is placed in a casting mold and said slurry is cast into said casting mold, in said slurry supplying step, and
a removing the film step for removing the film after the slurry has hardened,
wherein said film and another film are stacked with a spacer interposed therebetween in said casting mold such that said patterned conductor faces said another film, and said slurry is cast into a space formed by said spacer, in said slurry supplying step, and
wherein the thermosetting resin precursor comprises hydroxyl-containing polymer and one of an isocyanate-containing gelling agent and an isothiocyanate-containing gelling agent.

2. A method according to claim 1, wherein a release agent applied to said film is different in peel force from a release agent applied to said another film.

* * * * *